United States Patent
Liu et al.

(10) Patent No.: US 6,829,127 B1
(45) Date of Patent: Dec. 7, 2004

(54) HIGH PERFORMANCE CAPACITOR STRUCTURE

(75) Inventors: Yow-Juang (Bill) Liu, San Jose, CA (US); Jayakannan Jayapalan, San Jose, CA (US); Francois Gregoire, Cupertino, CA (US); Peter John McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/383,133

(22) Filed: Mar. 5, 2003

(51) Int. Cl.[7] ................................................. H02H 3/00
(52) U.S. Cl. ....................... 361/100; 438/386; 438/239; 438/243; 430/311; 430/313; 437/52; 437/40; 257/296; 257/310
(58) Field of Search ......................... 361/100; 438/386, 438/239, 243; 430/311, 313; 437/52, 40; 257/296, 310

(56) References Cited

U.S. PATENT DOCUMENTS

| | | | | |
|---|---|---|---|---|
| 5,068,200 A | * | 11/1991 | Kang et al. | 438/253 |
| 6,078,093 A | * | 6/2000 | Lee | 257/532 |
| 6,107,105 A | * | 8/2000 | Sandhu | 438/3 |
| 6,184,152 B1 | * | 2/2001 | Lin | 438/753 |
| 6,285,050 B1 | * | 9/2001 | Emma et al. | 257/296 |
| 6,319,787 B1 | * | 11/2001 | Enders et al. | 438/286 |
| 6,337,173 B2 | * | 1/2002 | Jen et al. | 430/313 |
| 6,420,880 B1 | * | 7/2002 | Miller | 324/537 |

* cited by examiner

Primary Examiner—William H. Mayo
Assistant Examiner—Anton Harris
(74) Attorney, Agent, or Firm—Morgan, Lewis & Bockius, LLP

(57) ABSTRACT

A capacitive electrode structure for use in an integrated circuit fabricated on a substrate comprises a first electrode formed by a diffusion region in the substrate, an insulating layer formed on the diffusion region, and a second electrode formed by a conductive layer deposited on said insulating layer. To increase the capacitance per chip area of the capacitive electrode structure, a plurality of recesses are formed in the first electrode on an upper surface thereof with a lower surface of the second electrode substantially following a contour of these recesses. In one embodiment, the capacitive electrode structure is employed for a capacitor formed between a control gate and a floating gate in an EEPROM cell. Capacitors in other types of integrated circuit can be likewise formed using the electrode structure of the present invention. Preferably, the recesses in the diffusion region are formed concurrently with oxide-filled isolation trenches in the substrate used to isolate adjacent circuit elements from each other.

22 Claims, 5 Drawing Sheets

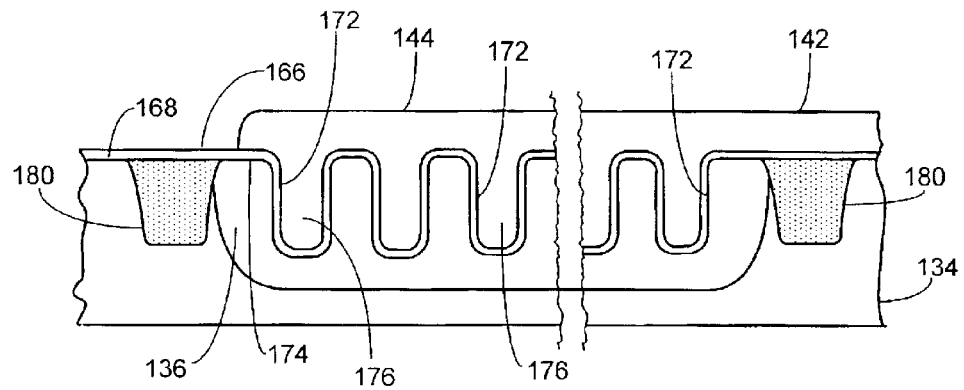
FIG. 4
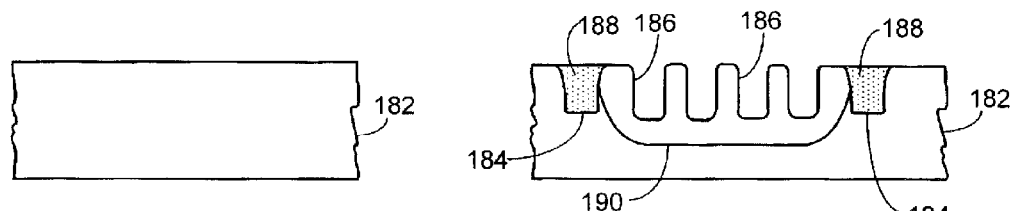
FIG. 7a
FIG. 7d
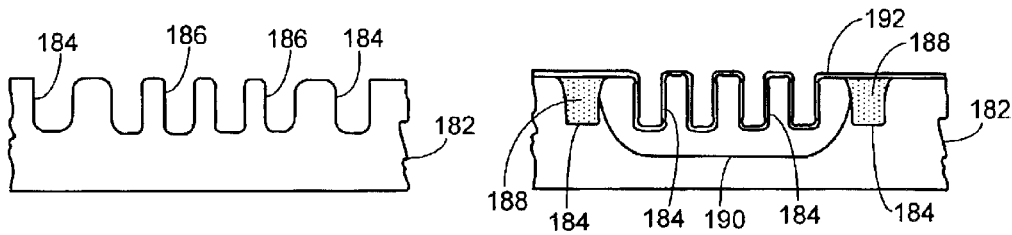
FIG. 7b
FIG. 7e
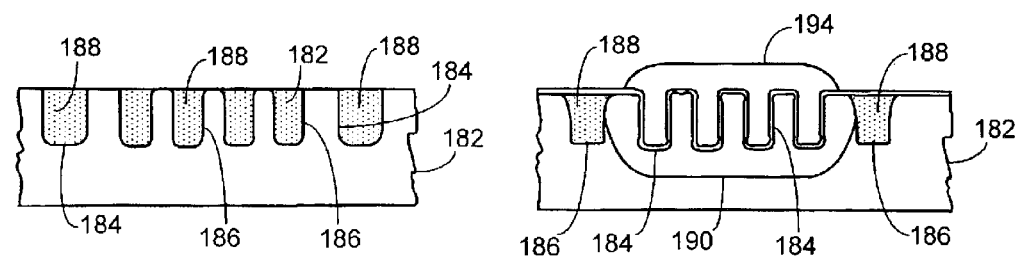
FIG. 7c
FIG. 7f

HIGH PERFORMANCE CAPACITOR STRUCTURE

BACKGROUND OF THE INVENTION

The present invention relates to reduced-size capacitor structures for integrated circuits.

In integrated circuit technology, reducing the size of circuit structures is a general goal as it allows higher integration density, faster circuit operation and less power consumption. One type of widely-used circuit structure is a capacitor, which in principle is composed of two electrodes separated and insulated from each other by a dielectric layer. Reducing the thickness of the dielectric layer increases the capacitance of the capacitor; so does increasing the capacitor's effective electrode area. Because avoidance of undesired breakdown and tunneling effects sets a limit on the minimum thickness of the dielectric layer, reducing the chip area occupied by the capacitor without decreasing the effective electrode area is crucial to achieving desired capacitance values while attaining higher levels of circuit integration. Therefore, it is highly desirable to have an innovative circuit structure that allows formation of capacitors of reduced size, yet high capacitance.

SUMMARY OF THE INVENTION

The present invention provides a high-performance capacitive electrode structure that supports down-scaling of integrated circuits and allows die size reduction. The electrode structure is fabricated on a substrate and comprises a first electrode and a second electrode. The first electrode is formed by a diffusion region in the substrate, while the second electrode is formed by a conductive layer that is deposited on an insulating layer formed atop the diffusion region. A plurality of recesses are formed in the first electrode on an upper surface thereof, and a lower surface of the second electrode substantially follows a contour of these recesses. In this way, the effective electrode area of the capacitive electrode structure is enhanced without increasing its overall size. In a preferred embodiments the recesses, which can be formed of, for example, holes or grooves, are formed concurrently with isolation trenches in the substrate that are subsequently filled with a field oxide for the purpose of isolating adjacent circuit elements from each other.

BRIEF DESCRIPTION OF THE DRAWINGS

The present invention and advantages thereof will be better understood from the following description when read in conjunction with the accompanying drawings, in which:

FIG. 4 is a schematic cross-sectional view similar to FIG. 3 and illustrates one embodiment of a capacitive electrode structure according to the present invention;

FIGS. 7a–7f schematically illustrate process steps for fabricating an integrated circuit including a capacitive electrode structure according to the present invention.

DETAILED DESCRIPTION OF THE DRAWINGS

The capacitive electrode structure of the present invention will be described first in regard to its application in an EEPROM cell. EEPROM (electrically erasable/programmable read only memory) is one type of non-volatile memory that allows a user to electrically program and erase information. Typically, an EEPROM memory device comprises a large number of EEPROM cells arranged in array form.

Figure 1:
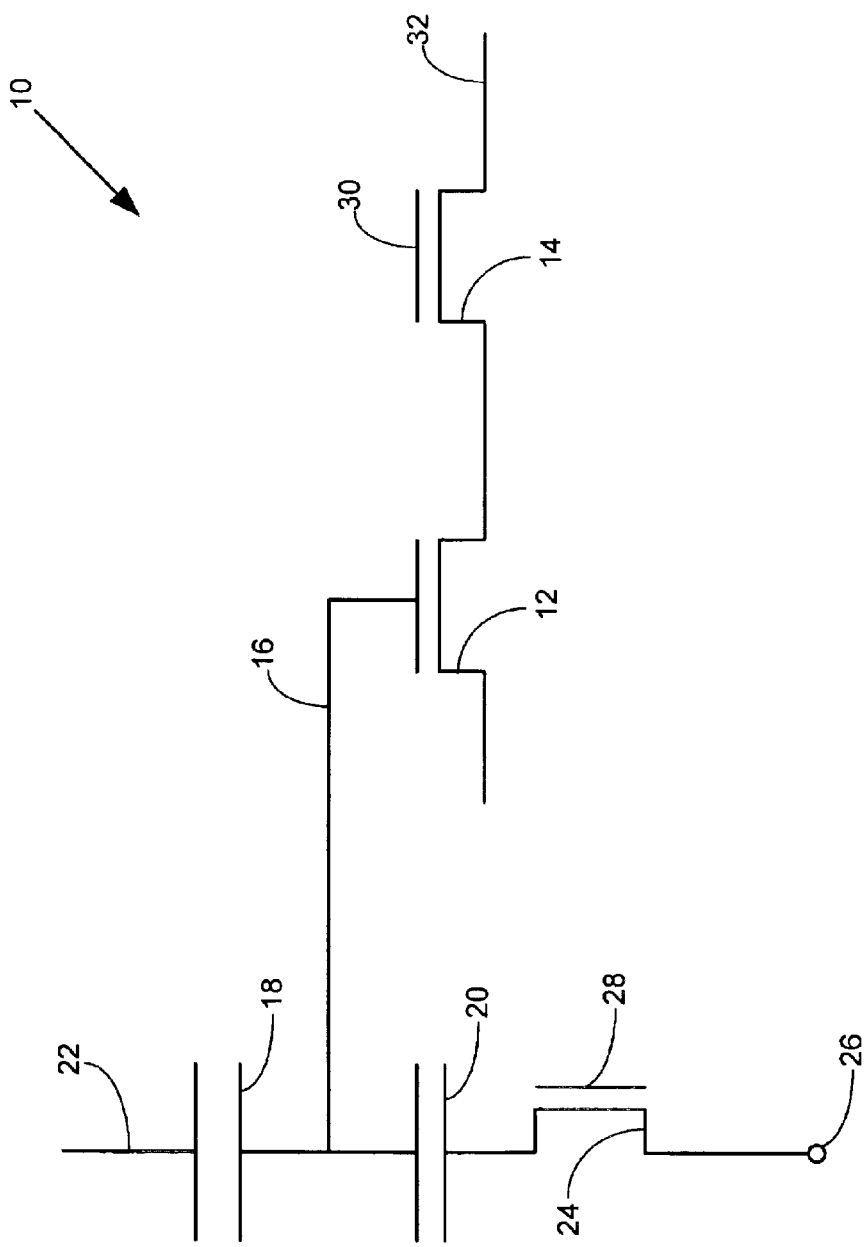
FIG. 1 is a schematic circuit diagram of an exemplary EEPROM cell.

In FIG. 1, an exemplary EEPROM cell is designated 10. Cell 10 includes a floating gate n-channel MOS (metal-oxide-semiconductor) transistor 12 coupled in series with another n-channel MOS transistor 14. Transistors 12 and 14 are often referred to as memory transistor and read select transistor, respectively. The floating gate, designated 16, of transistor 12 is used to change the threshold voltage of transistor 12 from its natural state by moving electrical charge on and off floating gate 16. Two different states, one of higher transistor threshold voltage and one of lower threshold voltage, are needed to define on and off states of EEPROM cell 10. In one state, excess electrons may be trapped on floating gate 16, increasing the transistor threshold voltage to a higher than normal value. In another state, floating gate 16 may be positively charged, decreasing the threshold voltage of transistor 12 to a lower than normal value. In the following, a cell state of higher threshold voltage is referred to as a programmed state, whereas a cell state of lower threshold voltage is referred to as an erased state.

Cell 10 further includes a first capacitor 18 and a second capacitor 20. First capacitor 18 is formed between floating gate 16 and a control gate 22 of cell 10, whereas second capacitor 20 is formed between floating gate 16 and another n-channel MOS transistor 24 often referred to as write column transistor. Second capacitor 20 includes a tunnel window allowing electrons to tunnel through second capacitor 20 when a sufficient voltage is applied across second capacitor 20.

To program cell 10, a high positive programming voltage of, for example, 5V to 15V or more is applied to control gate 22. Applying the programming voltage to control gate 22 raises the potential of floating gate 16 through capacitive coupling to a value sufficiently high to cause electrons to tunnel through the tunnel window of second capacitor 20 and accumulate on floating gate 16. To erase cell 10, electrons on floating gate 16 are removed by applying a similarly high positive voltage as used in the programming of cell 10 to a node 26 coupled to one of the source/drain regions of transistor 24 while at the same time applying a sufficiently high voltage to a gate 28 of transistor 24. This causes electrons to tunnel off floating gate 16 toward node 26.

During normal operation, control gate 22 is held at a potential somewhere between the threshold voltage of transistor 12 in the programmed state and that in the erased state. Thus, if in the programmed state, transistor 12 is turned off during normal operation and is turned on if in the erased state. In this way, the state of cell can be easily read by applying a regular logic voltage such as 3 V or less with respect to ground potential to a gate 30 and a drain 32 of transistor 14, thus causing transistor 14 to conduct, and sensing the amount of a read current flowing through the chain of transistors 12 and 14.

First capacitor 18 and second capacitor 20 are coupled in series. This requires the capacitance of first capacitor 18 to be large compared to that of second capacitor in order to have most of the high voltage applied during programming and erasing of cell 10 appear across second capacitor 20, thus achieving the high potential gradient necessary for electrons to tunnel through the tunnel window of capacitor 20.

Figure 2:
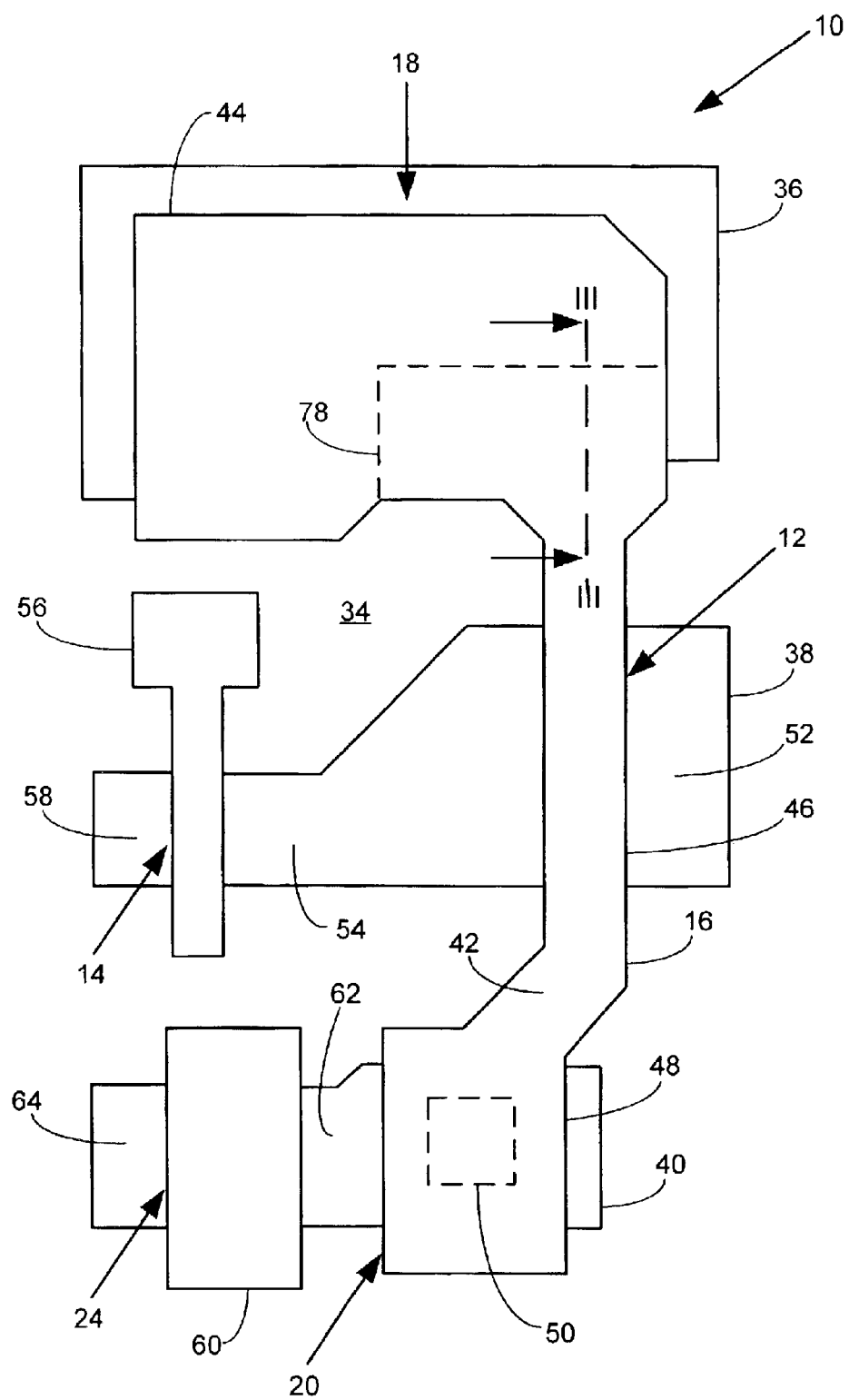
FIG. 2 schematically illustrates a conventional layout of an EEPROM cell.

Cell 10 can be fabricated on a semiconductor (such as silicon) substrate using a standard single poly-silicon process. FIG. 2 depicts a conventional layout of cell 10 on a semiconductor substrate 34. The layout of cell 10 comprises first, second and third heavily doped n-diffusion regions 36, 38 and 40, respectively, formed in substrate 34. Floating gate 16 is formed by a conductive layer 42 on top of substrate 34, which is separated from substrate 34 by dielectric material (not shown in FIG. 2). Conductive layer 42 is formed of poly-silicon deposited on the dielectric material. Alternatively, conductive layer 42 may be a polysilicide layer.

Conductive layer 42 comprises a first portion 44 located on top of first diffusion region 36, a second portion 46 overlying second diffusion region 38 and a third portion 48 overlying third diffusion region 40. First portion 44 of conductive layer 42 and first diffusion region 36 form opposing electrodes of first capacitor 18, whereas third portion 48 of conductive layer 42 and third diffusion region 40 form opposing electrodes of second capacitor 20. The tunnel window of capacitor 20 is indicated in FIG. 2 by dashed lines and is given the reference numeral 50.

Transistor 12 is realized by second portion 46 of conductive layer 42 and two sub-regions 52, 54 of second diffusion region 38 on opposite sides of second portion 46 of conductive layer 42. Diffusion sub-regions 52, 54 act as source and drain, respectively, of transistor 12. Transistor 14 is realized by a poly-silicon gate 56 overlying second diffusion region 38 and sub-regions 54, 58 of second diffusion region 38 on opposite sides of poly-silicon gate 56. Diffusion sub-regions 54, 58 act as source and drain, respectively, of transistor 14. Finally, transistor 24 is realized by a poly-silicon gate 60 formed on top of third diffusion region 40 and sub-regions 62, 64 of third diffusion region 40 on opposite sides of poly-silicon gate 60. Diffusion sub-regions 62, 64 act as source and drain, respectively, of transistor 24.

Figure 3:
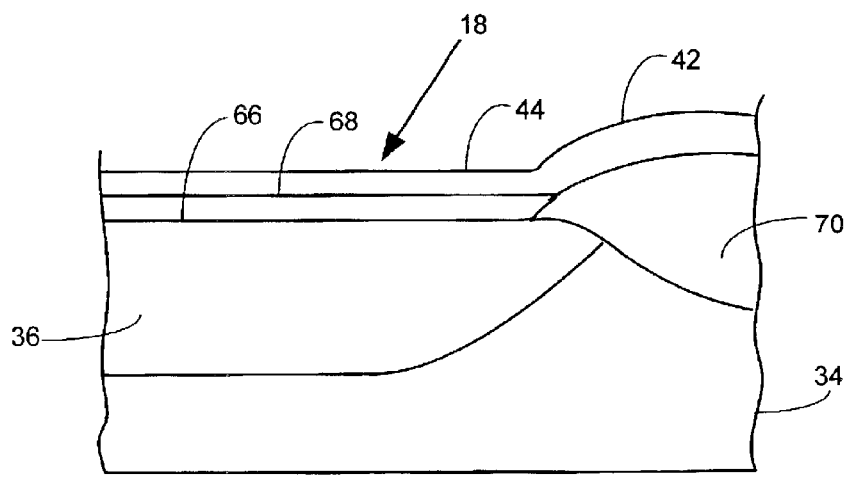
FIG. 3 schematically shows a cross-sectional view along III—III of FIG. 2.

As can be seen from FIG. 3, first diffusion region 36 is conventionally formed to have a flat surface 66 on which an oxide layer 68 is formed. Also, first portion 44 of conductive layer 42 is conventionally formed as a flat plate on top of oxide layer 68 so that oxide layer 68 separates conductive layer 42 from first diffusion region 36. Thus, in the conventional realization, capacitor 18 is a flat capacitor whose electrode surfaces facing each other are flat surfaces. For sake of completeness, reference numeral 70 designates a field oxide region isolating first diffusion region 36 from adjacent diffusion regions in substrate 34.

As already indicated above, to achieve a good coupling ratio, it is desirable that first capacitor 18 have a large capacitance in comparison to that of second capacitor 20. With the conventional flat realization of first capacitor 18, the chip area occupied by first capacitor 18 can be significant. As an example, in an EEPROM cell fabricated in a 0.3 $\mu$m single poly-silicon process, first capacitor 18 may account for up to approximately 25% of the entire chip area required by the cell. Reducing the thickness of oxide layer 68 is usually not considered a reliable means for achieving an overall size reduction of first capacitor 18 as the risk of undesired breakdown and leakage phenomena increases with decreasing oxide thickness.

The present invention addresses the above problem of large chip area consumption caused by first capacitor 18 and provides a capacitive electrode structure having a higher capacitance per chip area unit. An illustrative embodiment of the capacitive electrode structure of the present invention is depicted in FIG. 4.

In the embodiment of FIG. 4, a first diffusion region 136 is formed in a substrate 134. Over the first diffusion region but separated from it by an oxide layer 168 is a first portion 144 of a conductive layer 142. First diffusion region 136, substrate 134, oxide layer 168 and first portion 144 of conductive layer 142 correspond in circuit function to diffusion region 36, substrate 34, oxide layer 68 and first portion 44 of conductive layer 42 of FIGS. 1–3. However, unlike first diffusion region 36, first diffusion region 136 has a plurality of recesses 172 formed in its upper surface 166, and unlike first portion 44 of conductive layer 42, first portion 144 of conductive layer 142 has on a bottom side 174 thereof a plurality of complementary protrusions 176 extending into recesses 172. As a result, bottom side 174 of first portion 144 of conductive layer 142 substantially follows the contour of surface 166 of diffusion region 136 throughout recesses 172. As can be seen from FIG. 4, recesses 172 are filled to their top by the material of conductive layer 142.

In this way, the effective surface area of the capacitor electrodes of first capacitor 18, which are formed by first diffusion region 36 and first portion 44 of conductive layer 142, is increased considerably compared to the conventional flat capacitor structure shown in FIG. 3 without increasing the overall capacitor size. This results in a gain in capacitance per chip area unit that can be utilized to either reduce the overall size of first capacitor 18 without decreasing its capacitance or increase the capacitance of first capacitor 18 without requiring additional chip area. Indeed, we have found that using the approach of the present invention, a capacitance per chip area unit can be obtained that is several times, e.g., three, four or five times, the value in the conventional case of a flat capacitor structure. Turning again to FIG. 2, a chain dotted line 78 illustrates how much the chip area occupied by first capacitor 18, and consequently by cell 10 as a whole, can be diminished using the capacitive electrode structure of the present invention.

In addition thereto, a capacitance increase of first capacitor 18 attained through the recessed structure according to the present invention can significantly improve the cell coupling ratio and thus make possible lower voltages for write and erase operations. These lower programming voltages may translate into performance gain and reliability benefits. They also permit easier system integration by making it possible to lower the required programming voltage to near the level of the regular logic supply voltage. This in turn may result in reduced manufacturing costs.

Figure 5:
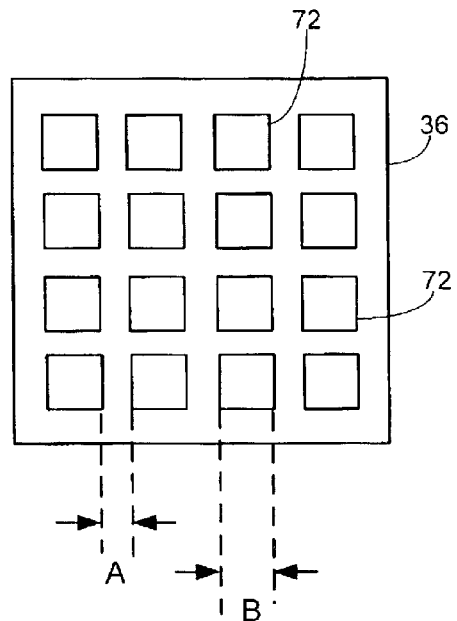
FIGS. 5 and 6 show two different embodiments of recesses formed in one of the electrodes of a capacitive electrode structure according to the present invention.
Figure 6:
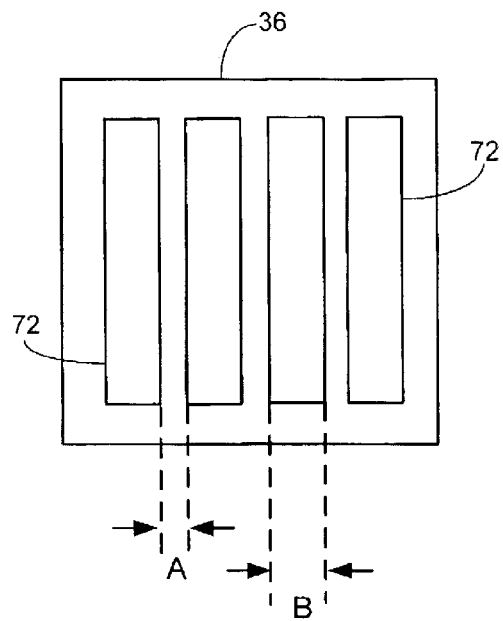

The number, shape and size of recesses 172 are determining factors for the capacitance of the capacitive electrode structure according to the present invention. Generally, no restrictions are imposed on the number, shape and size of recesses 172. In one embodiment, recesses 172 may be formed as holes arranged in a two-dimensional array, as is shown in FIG. 5. Although depicted to be square in plan view in FIG. 5, these holes may be any other form including, e.g., rectangular, circular, and oval. In another embodiment, recesses 172 may be formed as elongated grooves arranged in parallel to each other, such as illustrated in FIG. 6. While the grooves are shown to be rectilinear in FIG. 6, this is not necessary. Alternatively, they may be curved, for example. Furthermore, in FIG. 4, recesses 172 are shown to have sidewalls that are approximately perpendicular to surface 166 of first diffusion region 136. However, in other embodiments, recesses 172 may have sidewalls that are angled or curved. For example, recesses 172 may be envisioned to have a V-shape.

As a numerical example, which in no way is intended to be limiting, recesses 172, whether holes, grooves or other form, may have a depth of approximately 0.40 $\mu$m, although deeper or shallower recesses are likewise conceivable. In an integrated circuit fabricated using a 90 nm process, a spacing A (see FIGS. 5 and 6) between adjacent recesses 172 may be, e.g., approximately 0.12 $\mu$m, while a lateral recess width B (cf. FIGS. 5 and 6) may be approximately 0.14 $\mu$m, for example. For this example, the increase in surface area for the embodiments of FIGS. 5 and 6 is on the order of 300%. Of course, the invention may be practiced using holes, grooves, or structures having other dimensions as well, contingent upon, for instance, the chip fabrication technology used.

As for the number of recesses 172 in a capacitor formed in accordance with the present invention, this number can vary in a wide range. As an example, a capacitor can easily have 10 to 20 hole-type recesses 172 per square micrometer of chip area. However, it is to be understood that this number shall not be construed as limiting and maybe smaller or larger, dependent on the shape and size of the recesses and the chip fabrication technology used. In particular, as the technology advances and yet finer lines can be resolved, capacitors can be envisaged that include on the order of hundred or even more recesses 172 per square micrometer of chip area.

According to a preferred embodiment, recesses 172 may be formed concurrently with isolation trenches in a shallow-trench-isolation (STI) process. Shallow trench isolation is a technology used to isolate circuit elements such as transistors, capacitors, etc. from each other and is more and more replacing traditional LOCOS (local oxidation of silicon) isolation. In STI, trenches are formed in a semiconductor substrate by etching, and the trenches are subsequently filled with a field oxide, usually followed by additional steps that provide for planarization and other treatment of the substrate surface. For the purpose of illustration, such oxide-filled isolation trenches are shown in FIG. 4 where they are designated 180.

Select phases of a preferred process of fabricating an integrated circuit that includes both oxide-filled isolation trenches and one or more capacitive electrode structures according to the present invention are schematically depicted in FIGS. 7a–7f. In this process, the integrated circuit is fabricated on semiconductor substrate 134, which is shown in FIG. 7a. Substrate 134 may be, e.g., a silicon wafer. In FIG. 7b, isolation trenches 182 and recesses 172 have been formed in substrate 134. Trenches 182 and recesses 172 are formed at the same time in a single masking and subsequent etching process of substrate 134. They may be formed with the same or different depths. Also, they may have the same or different shapes. After forming trenches 182 and recesses 172, an oxide-filling process, e.g., a chemical vapor deposition (CVD) process, is carried out, resulting in all of trenches 182 and recesses 172 being filled with a field oxide 188. Substrate 134 is thereafter planarized by, e.g., chemical-mechanical polishing (CMP). FIG. 7c shows substrate 134 after its planarization. Field oxide 188 is then selectively removed from recesses 172 by etching, which requires a single additional masking step over the conventional STI process. After removal of field oxide 188 from recesses 172, a standard single poly-silicon process is carried out to form the one or more capacitive electrode structures according to the present invention. This includes forming heavily doped diffusion implant 136 in substrate 134 (FIG. 7d), thermally growing thin oxide layer 168 on top of diffusion implant 136 (FIG. 7e), and depositing a poly-silicon layer 142 on oxide layer 168 (FIG. 7f).

Figure 8:
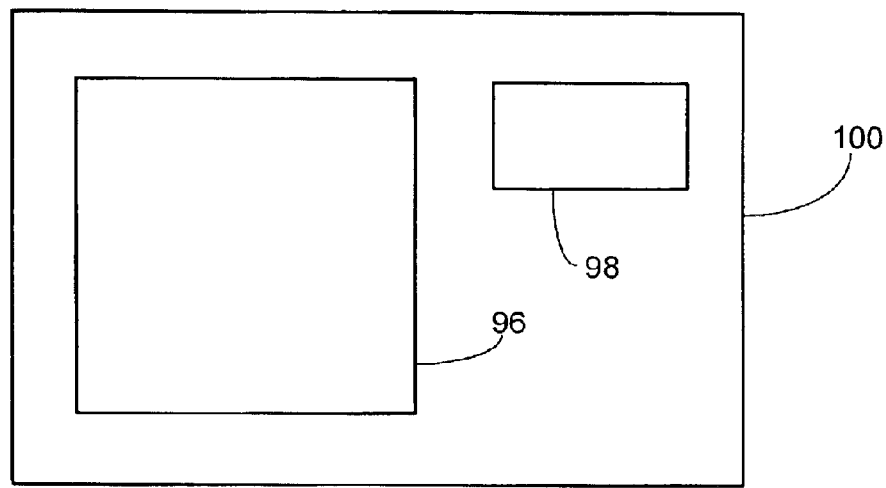
FIGS. 8 and 9 are schematic block diagrams of integrated circuits in which capacitive electrode structures according to the present invention can be advantageously used.

While in the foregoing an embodiment has been described in which the capacitive electrode structure according to the present invention was applied to an EEPROM cell, the invention can be applied to other types of integrated circuits as well. In the following, some exemplary alternate applications for the capacitive electrode structure of the present invention will be briefly discussed with reference to FIGS. 8 and 9. In the embodiment of FIG. 8, a cell array 96 of non-volatile memory cells and a charge pump circuit 98 are part of a memory chip 100. Charge pump circuit 98 steps up a chip supply voltage of, e.g., 5V, 3V or 1.8V to a high (positive or negative) programming voltage necessary to perform write and erase operations to the memory cells. Charge pump circuits are well-known in the art and need not be explained in further detail herein. It suffices to say that charge pump circuits in general include a number of capacitors, which may take up a significant portion of the chip area required by the charge pump circuit. Such capacitors are used, for example, as pump capacitors or in biasing the well or substrate. Forming some or all of these capacitors with the recessed capacitor structure according to the present invention can considerably reduce that chip area or allow more pump stages to be formed on the same chip area. Of course, the capacitive electrode structure of the present invention can be also be applied to capacitors in cell array 96.

Figure 9:
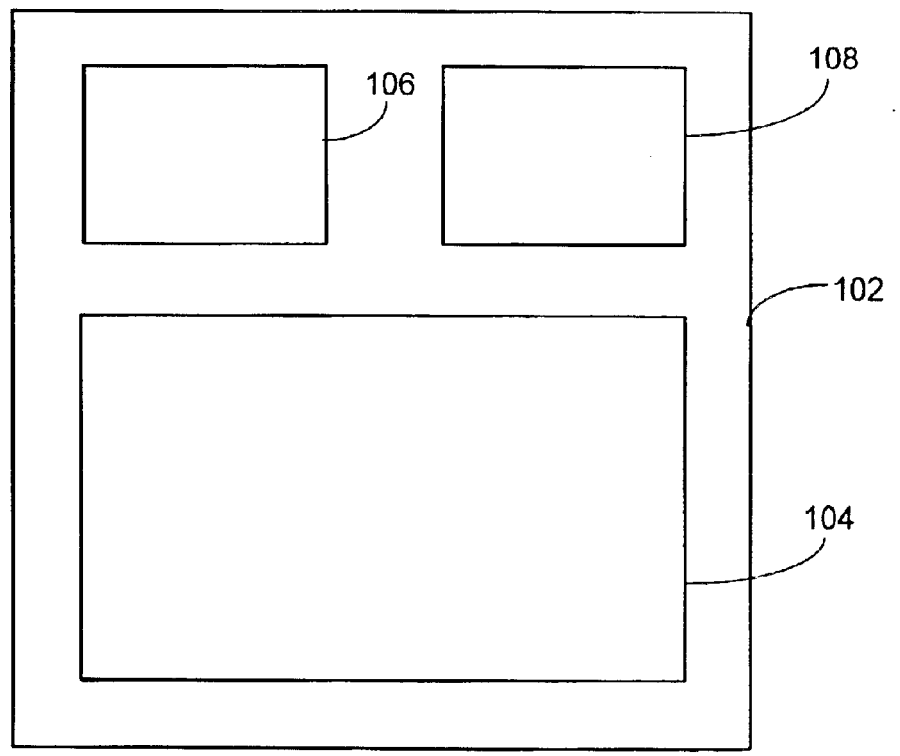

FIG. 9 depicts a programmable logic device (PLD) 102 that comprises on a single chip a logic section 104, a power supply section 106 and at least one phase locked loop (PLL) circuit 108 (in fact, modern PLD's may comprise a plurality of PLL's). Logic section 104 can be programmed by a user to perform various logic functions. Power supply section 106 delivers a regulated supply voltage to logic section 104, and PLL circuit 108 acts to deliver a synchronized clock signal to logic section 104. PLD's are well-known in the art, and as their detailed structure and function are not critical to the invention, a further explanation thereof is omitted herein.

PLL circuits typically include a number of capacitors, which may consume large chip area. Similarly, a decoupling capacitor included in a PLD's power supply section is often required to have a large capacitance, resulting in a high chip area consumption. In the embodiment of FIG. 9, using the capacitive electrode structure of the present invention for capacitors included in PLL circuit 108 and/or a decoupling capacitor included in power supply section 106 may significantly reduce the overall chip area required by PLD 102. The invention may also be used in a decoupling capacitor in other applications such as reducing noise.

Although the present invention has been described hereinbefore in detail, a person versed in the art will readily understand that various modifications can be made thereto without departing from the scope of the invention as defined by the appended claims.

What is claimed is:

1. A capacitive electrode structure comprising:
   a first electrode comprising a diffusion region in a substrate;

an insulating layer formed on said diffusion region; and a second electrode comprising a conductive layer deposited on said insulating layer;

wherein there are a plurality of recesses in said diffusion region on an upper surface thereof with a lower surface of said second electrode substantially following a contour of said recesses.

2. The capacitive electrode structure of claim 1, wherein said recesses are filled substantially to their top by said conductive layer.

3. The capacitive electrode structure of claim 1, wherein said conductive layer is a poly-silicon or polysilicide layer.

4. The capacitive electrode structure of claim 1 wherein said recesses are regularly distributed across said upper surface of said first electrode.

5. The capacitive electrode structure of claim 1, wherein said recesses are grooves.

6. The capacitive electrode structure of claim 1, wherein said recesses are holes.

7. The capacitive electrode structure of claim 1; wherein said recesses have a depth of less than 1 $\mu$m.

8. The capacitive electrode structure of claim 7, wherein said recesses have a depth of less than 0.7 $\mu$m.

9. The capacitive electrode structure of claim 8, wherein said recesses have a depth of from approximately 0.3 to 0.5 $\mu$m.

10. The capacitive electrode structure of claim 1, wherein said recesses have a depth substantially equal to that of dielectric-filled isolation trenches formed in said substrate to isolate adjacent circuit elements of said integrated circuit from each other.

11. The capacitive electrode structure of claim 1, wherein said capacitive electrode structure forms a capacitor coupled between a control gate and a floating gate of a non-volatile memory cell.

12. The capacitive electrode structure of claim 1, wherein said capacitive electrode structure forms a capacitor in a charge-pump circuit.

13. The capacitive electrode structure of claim 1, wherein said capacitive electrode structure forms a capacitor in a phase-locked loop circuit.

14. The capacitive electrode structure of claim 1 wherein said capacitive electrode structure forms a decoupling capacitor.

15. The capacitive electrode structure of claim 1, wherein said capacitive electrode structure forms a decoupling capacitor in a power supply section of a programmable logic device.

16. An integrated circuit comprising:

a first electrode comprising a diffusion region in a substrate;

an insulating layer formed on said diffusion region; and a second electrode comprising a conductive layer deposited on said insulating layer;

wherein there are a plurality of recesses in said diffusion region thereof with a lower surface of said second electrode substantially following a contour of said recesses.

17. The integrated circuit of claim 16 further comprising a non-volatile memory cell and said first and second electrodes and said insulating layer form a capacitor coupled between a control gate and a floating gate of said memory cell.

18. The integrated circuit of claim 16 wherein said first and second electrodes and said insulating layer form a capacitor in a charge-pump circuit.

19. The integrated circuit of claim 16 wherein said first and second electrodes and said insulating layer form a capacitor in a phase-locked loop circuit.

20. The integrated circuit of claim 16 wherein said first and second electrodes and said insulating layer form a decoupling capacitor.

21. In a method of manufacturing an integrated circuit on a substrate, said integrated circuit comprising a plurality of circuit elements isolated from each other by dielectric-filled isolation trenches formed in said substrate, at least one of said circuit elements including a capacitive electrode structure comprising:

a first electrode comprising a diffusion region in said substrate;

an insulating layer formed on said diffusion region; and a second electrode comprising a conductive layer deposited on said insulating layer;

wherein there are a plurality of recesses in said diffusion region on an upper surface thereof with a lower surface of said second electrode substantially following a contour of said recesses;

wherein said method comprises the steps of:

etching said substrate to form said isolation trenches and said recesses;

forming a dielectric in said isolation trenches and said recesses; and removing said dielectric from said recesses.

22. The method of claim 21, wherein said etching step comprises concurrently forming said isolation trenches and said recesses in a common etching process.

* * * * *